United States Patent
Woll et al.

(10) Patent No.: US 11,929,631 B2
(45) Date of Patent: Mar. 12, 2024

(54) METHOD FOR OPERATING A BATTERY MODULE

(71) Applicant: Robert Bosch GmbH, Stuttgart (DE)

(72) Inventors: Christoph Woll, Gerlingen (DE); Alexander Schmidt, Donaueschingen (DE); Tunan Shen, Leonberg (DE)

(73) Assignee: ROBERT BOSCH GMBH, Stuttgart (DE)

( * ) Notice: Subject to any disclaimer, the term of this patent is extended or adjusted under 35 U.S.C. 154(b) by 527 days.

(21) Appl. No.: 17/258,428

(22) PCT Filed: Jun. 7, 2019

(86) PCT No.: PCT/EP2019/064999
§ 371 (c)(1),
(2) Date: Feb. 8, 2021

(87) PCT Pub. No.: WO2020/011459
PCT Pub. Date: Jan. 16, 2020

(65) Prior Publication Data
US 2021/0273469 A1    Sep. 2, 2021

(30) Foreign Application Priority Data

Jul. 13, 2018  (DE) .......................... 102018211724.1

(51) Int. Cl.
*B60L 58/21* (2019.01)
*B60L 58/12* (2019.01)
(Continued)

(52) U.S. Cl.
CPC ............ *H02J 7/0047* (2013.01); *B60L 58/12* (2019.02); *H02J 7/0013* (2013.01); *B60L 2240/547* (2013.01)

(58) Field of Classification Search
None
See application file for complete search history.

(56) References Cited

U.S. PATENT DOCUMENTS

2005/0225290 A1   10/2005   Hashimoto et al.
2006/0273802 A1   12/2006   Murakami et al.
(Continued)

FOREIGN PATENT DOCUMENTS

DE   102014207395 A1   10/2015
DE   102017116573 A1    2/2018
(Continued)

OTHER PUBLICATIONS

International Search Report for PCT/EP2019/064999, dated Sep. 24, 2019.

*Primary Examiner* — Richard Isla
*Assistant Examiner* — Javier A. Bernal Sosa
(74) *Attorney, Agent, or Firm* — NORTON ROSE FULBRIGHT US LLP; Gerard A. Messina

(57) ABSTRACT

A method for operating a battery module, including multiple battery cells. The method includes: a) ascertaining cell voltages of the individual battery cells at a starting point in time; b) ascertaining at the starting point in time an average cell voltage from the cell voltages of the battery cells ascertained at the starting point in time; c) estimating the cell voltage of at least one battery cell at an operating point in time if the cell voltage of the battery cell is not measurable at the operating point in time, taking into account the cell voltage of the battery cell ascertained at the starting point in time, the average cell voltage ascertained at the starting point in time, and an average cell voltage ascertained at the operating point in time.

10 Claims, 3 Drawing Sheets

(51) Int. Cl.
    *G01R 31/367*     (2019.01)
    *G01R 31/3835*     (2019.01)
    *G01R 31/396*     (2019.01)
    *H02J 7/00*     (2006.01)

(56) References Cited

U.S. PATENT DOCUMENTS

| | | | | |
|---|---|---|---|---|
| 2014/0145685 A1* | 5/2014 | Bosch | ............... | G01R 31/3835 324/426 |
| 2018/0034113 A1* | 2/2018 | Gibbs | ............... | H01M 10/0525 |
| 2019/0187221 A1* | 6/2019 | Mukuno | ............... | G01R 31/367 |

FOREIGN PATENT DOCUMENTS

| | | | | |
|---|---|---|---|---|
| WO | 2015037292 A1 | 3/2015 | | |
| WO | WO-2015037292 A1 * | 3/2015 | ............... | B60L 11/18 |
| WO | WO-2016166713 A2 * | 10/2016 | | |

\* cited by examiner

METHOD FOR OPERATING A BATTERY MODULE

FIELD

The present invention relates to a method for operating a battery module including multiple battery cells, in particular, in an electrically driven vehicle, the cell voltages of the individual battery cells being ascertained. The method according to the present invention allows, in particular, a further operation of the battery module in the case of an error, when a cell voltage of a battery cell is not measurable at an operating point in time.

BACKGROUND INFORMATION

Today's battery modules in battery systems of electrically driven vehicles include multiple battery cells. The battery modules are designed in such a way that the individual battery cells are interconnected in series to one another in order to be able to provide a sufficiently high voltage. During the operation of the vehicle, the battery cells are discharged for driving the vehicle and for supplying further consumers. However, even in a vehicle at rest, a small discharge of the battery cells takes place in the form of a self-discharge.

In the process, the discharging of the battery cells does not necessarily take place uniformly. The voltages of the battery cells are thus not all at the same level. The reason for this lies in the different self-discharges as well as in the different aging of the individual cells. With increased aging, the battery cells are more rapidly discharged. The battery cell having the highest voltage determines the end of a charge process and the battery cell having the lowest voltage determines the end of a discharge process.

Today's electrically driven vehicles include a battery management system, which contains monitoring functions and diagnostic functions from component protection up to and including occupant safety. The cell voltages of the individual battery cells are, in particular, measured and monitored. If errors occur in the battery system, they must be identified as quickly as possible and an action must be taken. In the case of an error, a vehicle is not necessarily immediately shut down, since this represents a safety risk to following traffic. Depending on the error severity, the vehicle is shifted into an emergency operation and is still able to drive further for a certain period of time under reduced power until a safe parking place is found or, in the case of critical errors, for example a short-circuit of a battery cell, the battery contactor opens and the vehicle simply coasts to a stop.

In an autonomous, electrically driven vehicle, in particular in an autonomous shuttle or robotaxi, no driver is present, who is able to intervene in a case of error in order to safely maneuver the vehicle out of a hazardous area. The vehicle itself must be able to decide how it handles the instantaneous error, for example, whether a continuation of the trip to the next service station or to the final stop is possible, or whether an immediate stop must be made. If necessary, it must be decided whether the vehicle is able to be operated under the same power or whether the continuation of the trip takes place under reduced power and at reduced speed.

Due to a failure of a measuring line, it is no longer possible to measure the cell voltage of the affected battery cell. In today's vehicles, this results in a shutdown of the entire battery systems for safety reasons, or in a shutdown of the affected battery module, and thus in a reduced driving operation. This means that the vehicle is only able to continue under reduced power and thus at reduced speed. This emergency operation makes it possible to safely move off the road and to be able to park the vehicle on a parking lot or in an emergency rest stop or to also still reach the nearest repair shop. There are different safety levels for autonomous driving, which differ, among other things, in travel distances of various lengths after an error has occurred.

SUMMARY

In accordance with an example embodiment of the present invention, a method is provided for operating a battery module including multiple battery cells. The battery cells in this case are, in particular, electrically interconnected in series. The battery module is used, for example, in an electrically driven vehicle, the cell voltages of the individual battery cells being measured. The method according to the present invention is used to ensure a further operation of the battery module in the case of an error if a cell voltage of a battery cell of the battery module is no longer measurable at an operating point in time.

The method according to an example embodiment of the present invention in this case encompasses at least the following steps: in a step a) the cell voltages of the individual battery cells are ascertained at a starting point in time. The ascertained cell voltage of a battery cell at the starting point in time is, for example, a voltage of the battery cell measured at the starting point in time itself or at a measuring point in time occurring before the starting point in time. The ascertained cell voltage of a battery cell at the starting point in time may also be calculated from multiple measured values, which have been recorded at multiple measuring points in time before the starting point in time.

The battery module is intact at the starting point in time as well as at the measuring points in time occurring before the starting point in time. There is, in particular, no interruption of a measuring line present, and all cell voltages of all battery cells are measurable. The values of the cell voltages of the individual battery cell ascertained at the starting point in time are advantageously stored.

In a step b), an average cell voltage is ascertained at the starting point in time from the cell voltages of the battery cells ascertained at the starting point in time. The average cell voltage is ascertained, for example, as an arithmetic average value of all ascertained values of the cell voltages of the individual battery cells. The average cell voltage thus ascertained is also advantageously stored.

In a step c), the cell voltage of at least one battery cell at an operating point in time is estimated if the cell voltage of the relevant battery cell is not measurable at the operating point in time. The step c) is thus carried out if an error in the battery module has occurred, as a result of which the cell voltage of the relevant battery cell is no longer measurable. Such an error occurs, for example, when a measuring line between the relevant battery cell and a measuring circuit is interrupted.

When estimating the cell voltage of the relevant battery cell, the cell voltage of the relevant battery cell ascertained at the starting point in time, the average cell voltage ascertained at the starting point in time, and an average cell voltage ascertained at the operating point in time are taken into account in the process. The average cell voltage ascertained at the operating point in time is ascertained in this case from the cell voltages of the remaining intact battery cells at the operating point in time.

Thus, when estimating the cell voltage of the relevant battery cell, it is taken into account, in particular, which cell voltage the battery cell had before the error occurred, when a direct measurement of the cell voltage was still possible. It is also taken into account how the cell voltages of the remaining intact battery cells change during ongoing operation. In this case, it is assumed that the cell voltage of the relevant battery cell changes in a similar manner.

According to one advantageous embodiment of the present invention, the steps mentioned below are also carried out after step b) and before step c), i.e., in particular, still before an error occurs, as a result of which the cell voltage of at least one battery cell is no longer measurable:

Initially, an upper threshold value "SO" is ascertained as a sum of average cell voltage "MS" ascertained at the starting point in time and a tolerance value "T". The aforementioned tolerance value is predefined, for example, by a known measuring accuracy of the measuring circuit. The upper threshold value is calculated as follows:

$$SO=MS+T$$

Furthermore, a lower threshold value "SU" is ascertained as the difference of average cell voltage "MS" ascertained at the starting point in time and a tolerance value "T". The aforementioned tolerance value is predefined, for example, by a known measuring accuracy of the measuring circuit and corresponds to the previously mentioned tolerance value. The lower threshold value is calculated as follows:

$$SU=MS+T$$

Battery cells, whose cell voltage at the starting point in time is higher than the upper threshold, are subsequently classified as good battery cells.

Similarly, battery cells, whose cell voltage at the starting point in time is lower than the lower threshold value, are classified as bad battery cells.

Battery cells, whose cell voltage at the starting point in time is lower than the upper threshold value or equal to the upper threshold value and higher than the lower threshold value or equal to the lower threshold value, are also classified as neutral battery cells.

Thus, a classification of the battery cells of the battery module has taken place before the implementation of step c), i.e., in particular, before an error occurs, as a result of which the cell voltage of at least one battery cell is no longer measurable.

During implementation of step c), the cell voltage of a good battery cell at the operating point in time is advantageously estimated as the sum of the average cell voltage "MB" ascertained at the operating point in time and a difference of cell voltage "US" of the good battery cell ascertained at the starting point in time and the average cell voltage "MS" ascertained at the starting point in time. Cell voltage "UB" of the good battery cell estimated at the operating point in time is calculated as follows:

$$UB=MB+US-MS$$

The cell voltage of the good battery cell ascertained at the starting point in time is greater than the average cell voltage ascertained at the starting point in time. Thus, the cell voltage of the good battery cell estimated at the operating point in time is also greater than the average cell voltage ascertained at the operating point in time.

In this case, a charging of the good battery cell is omitted if the cell voltage of the good battery cell estimated at the operating point in time is greater than an upper limiting value. The upper limiting value depends in this case on a maximum allowable charging voltage, which is also referred to as "Charging Voltage Limit" (CVL). The upper limiting value is, for example, 90% of the maximum allowable charging voltage. In this way, damage due to an overcharging of the good battery cell, whose cell voltage is not measurable at the operating point in time, is reliably prevented.

A charging of all battery cells of the battery module may also be omitted if the cell voltage of the good battery cell estimated at the operating point in time is greater than the upper limiting value.

During implementation of step c), the cell voltage of a bad battery cell at the operating point in time is advantageously estimated as the sum of average cell voltage "MB" ascertained at the operating point in time and a difference of cell voltage "US" of the bad battery cell ascertained at the starting point in time and average cell voltage "MS" ascertained at the starting point in time. Cell voltage "UB" of the good battery cell estimated at the operating point in time is calculated as follows:

$$UB=MB+US-MS$$

The cell voltage of the bad battery cell ascertained at the starting point in time is less than the average cell voltage ascertained at the starting point in time. Thus, the cell voltage of the bad battery cell estimated at the operating point in time is also less than the average cell voltage ascertained at the operating point in time.

In this case, a discharging of the bad battery cell is preferably omitted if the cell voltage of the bad battery estimated at the operating point in time is less than a lower limiting value. The lower limiting value in this case depends on a minimum allowable charging voltage, which is also referred to as "Discharging Voltage Limit." The lower limiting value is, for example, 110% of the minimum allowable charging voltage. In this way, damage due to a deep discharge of the bad battery cell, whose cell voltage is not measurable at the operating point in time, is reliably prevented.

A discharging of all battery cells of the battery module may also be omitted if the cell voltage of the bad battery cell estimated at the operating point in time is less than the lower limiting value.

During implementation of step c), the cell voltage of a neutral battery cell at the operating point in time is advantageously estimated as average cell voltage "MB" ascertained at the operating point in time. Cell voltage "UB" of the neutral battery cell estimated at the operating point in time is calculated as follows:

$$UB=MB$$

In this case, a charging of the neutral battery cell is preferably omitted if the cell voltage of the neutral battery estimated at the operating point in time is greater than an upper limiting value, and/or if the cell voltage of at least one good battery cell measured at the operating point in time is greater than the upper limiting value. The upper limiting value in this case depends on a maximum allowable charging voltage, which is also referred to as "Charging Voltage Limit." The upper limiting value is, for example, 90% of the maximum allowable charging voltage. In this way, damage due to an overcharging of the neutral battery cell, whose cell voltage is not measurable at the operating point in time, is reliably prevented.

A charging of all battery cells of the battery module may also be omitted if the cell voltage of the neutral battery cell estimated at the operating point in time is greater than the upper limiting value.

In this case, a discharging of the neutral battery cell is preferably omitted if the cell voltage of the neutral battery estimated at the operating point in time is less than a lower limiting value, and/or if the cell voltage of at least one bad battery cell measured at the operating point in time is less than the lower limiting value. The lower limiting value in this case depends on a minimum allowable charging voltage, which is also referred to as "Discharging Voltage Limit" (DVL). The lower limiting value is, for example, 110% of the minimum allowable charging voltage. In this way, damage due to a deep discharge of the neutral battery cell, whose cell voltage is not measurable at the operating point in time, is reliably prevented.

A discharging of all battery cells of the battery module may also be omitted if the cell voltage of the neutral battery cell estimated at the operating point in time is less than the lower limiting value.

The method according to the present invention is advantageously used in, among other things, a battery module of a pure electric vehicle, of a hybrid vehicle, of a plug-in hybrid vehicle or of an e-bike. Other uses are also possible, however.

A significant increase in safety during the operation of a battery module as well as of an electric vehicle is achievable with the aid of the method according to an example embodiment of the present invention. The example method according to the present invention allows, in particular, the battery module as well as the electric vehicle to continue to operate under particular conditions, even if the cell voltage of a battery cell of the battery module is no longer measurable. The aforementioned increase in safety is achieved, in particular, without additional hardware expenditure. All that is required is a software adaptation, for example, in the battery management system.

The example method according to the present invention is therefore implementable, in particular, in a cost-effective manner. All essential measured values are already available to the battery management system and need only to be processed accordingly. In the classification of the battery cells, an arbitrary clustering of different battery cells is applicative as well as implementable using methods of artificial intelligence. Safety levels via safety thresholds, for example, upper limiting values and lower limiting values, are individually adaptable. With the aid of the method according to the present invention, it is possible, for example, to ensure that a shuttle still reaches a next stop on time, and that a continuation of the trip to a final stop or to a service station is possible, where a repair may take place. A greater range is also achievable. The method is not dependent on the battery size and on the battery module structure, in particular, on the type of the interconnection, serial or in parallel, of the battery cells.

BRIEF DESCRIPTION OF THE DRAWINGS

Specific embodiments of the present invention are explained in greater detail with reference to the figures and to the description below.

DETAILED DESCRIPTION OF EXAMPLE EMBODIMENTS

Figure 1:
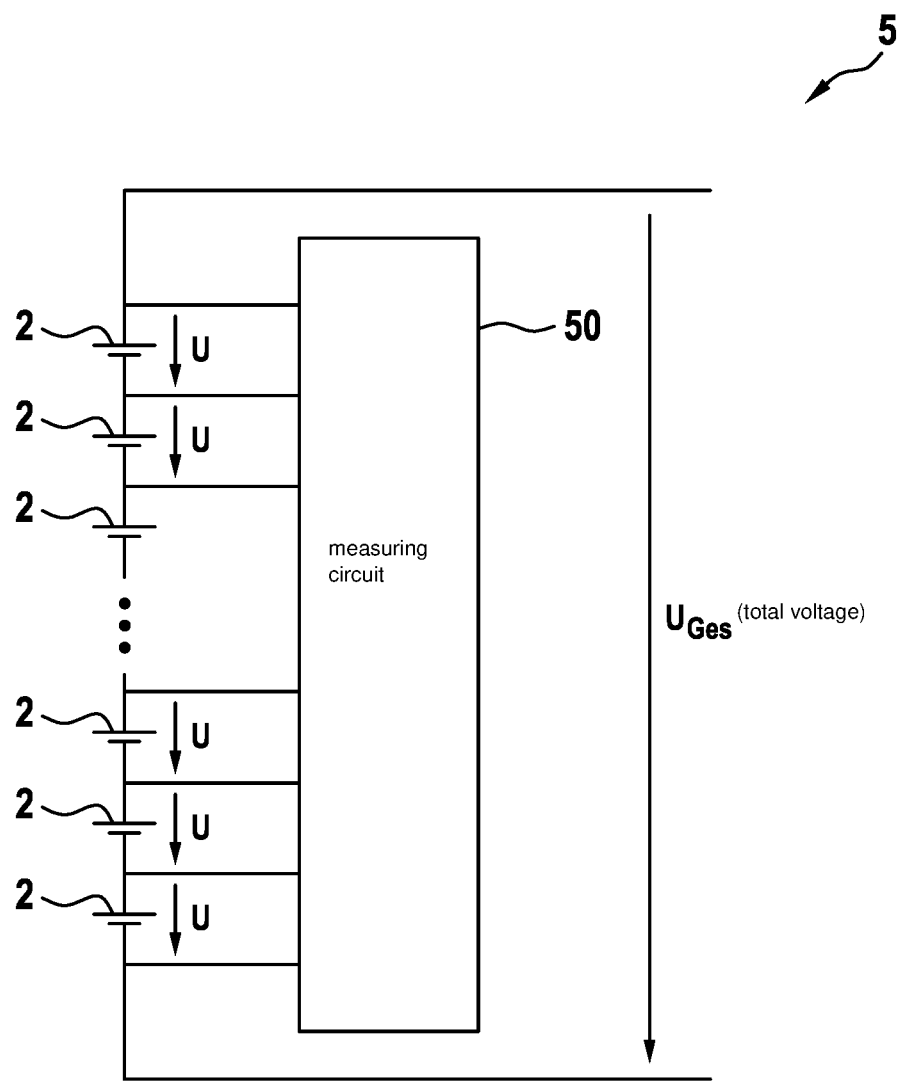
FIG. 1 schematically shows a representation of a battery module including multiple battery cells.

In the following description of the specific embodiments of the present invention, identical or similar elements are identified by the same reference numerals, a repeated description of these elements in individual cases being omitted. The figures represent only schematically the subject matter of the present invention.

FIG. 1 schematically shows a representation of a battery module 5 including multiple battery cells 2. Battery cells 2 in the present case are electrically interconnected in series. Each battery cell 2 includes an electrode unit, which includes one anode and one cathode each. The anode of the electrode unit is connected to a negative terminal of battery cell 2. The cathode of the electrode unit is connected to a positive terminal of battery cell 2. To serially interconnect battery cells 2 of battery module 5, the negative terminal of a battery cell 2 is electrically connected in each case to the positive terminal of adjacent battery cell 2.

Battery module 5 also includes a measuring circuit 50. Measuring circuit 50 is used to measure cell voltages U of battery cells 2 of battery module 5 and to measure a total voltage UGes of battery module 5. Total voltage UGes of battery module 5 corresponds in the present case to the sum of cell voltages U of individual battery cells 2. Battery cells 2 are connected to measuring circuit 50 with the aid of measuring lines.

Figure 2:
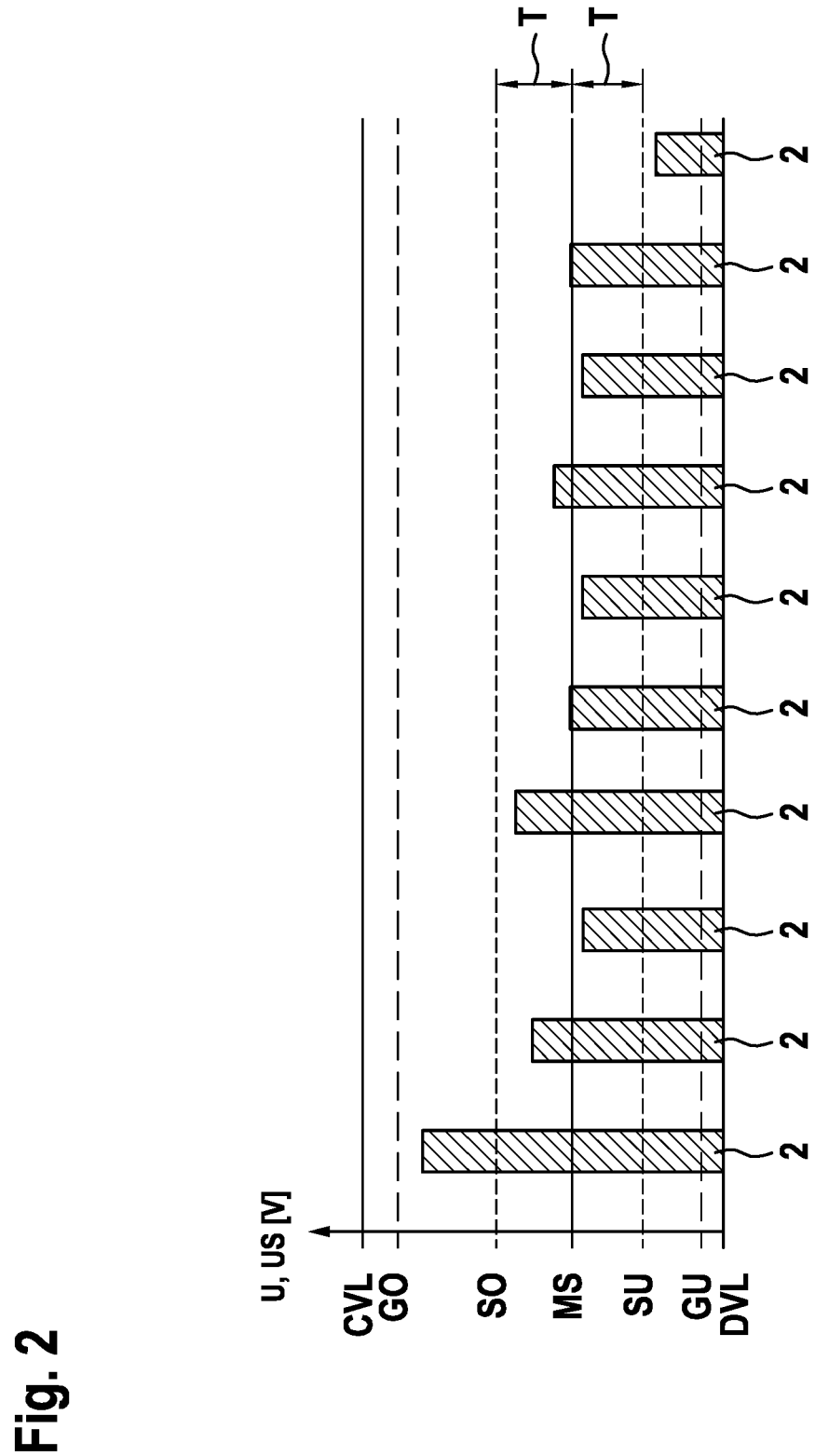
FIG. 2 shows a diagram for representing cell voltages of the battery cells of the battery module at a starting point in time.

FIG. 2 shows a diagram for representing cell voltages US of battery cells 2 of battery module 5 represented in FIG. 1 at a starting point in time. Battery module 5 is intact at the starting point in time, in particular, none of the measuring lines are interrupted, and all cell voltages US of all battery cells 2 are measurable at the starting point in time.

An average cell voltage MS at a starting point in time is ascertained from all cell voltages US of all battery cells 2 of battery module 5 ascertained at the starting point in time. Average cell voltage MS at the starting point in time is ascertained in the present case as an arithmetic average value of all ascertained values of cell voltages US at the starting point in time of individual battery cells 2.

An upper threshold value SO is subsequently ascertained as the sum of ascertained average cell voltage MS at the starting point in time and a tolerance value T. A lower threshold value SU is also ascertained as the difference of ascertained average cell voltage MS at the starting point in time and a tolerance value T. In the present example, tolerance values T, which are used to ascertain upper threshold value SO and lower threshold value SU, are identical. Aforementioned tolerance value T is, predefined, for example, by a known measuring accuracy of measuring circuit 50.

Battery cells 2, whose cell voltage US at the starting point in time is higher than upper threshold value SO, are then classified as good battery cells 2. Similarly, battery cells 2, whose cell voltage US at the starting point in time is less than lower threshold value SU, are classified as bad battery cells 2. Battery cells 2, whose cell voltage US at the starting point in time is less than upper threshold value SO or equal to upper threshold value SO and higher than lower threshold value SU or equal to lower threshold value SU, are also classified as neutral battery cells 2. As is apparent from the diagram, eight battery cells 2 are classified in the present case as neutral battery cells 2, one battery cell 2 is classified as good battery cell 2, and one battery cell 2 is classified as bad battery cell 2.

A charging of a battery cell 2 is omitted if its measured cell voltage UB at an operating point in time is greater than a maximum allowable charging voltage CVL. A charging of a battery cell 2 is omitted if its estimated cell voltage UB at an operating point in time is greater than an upper limiting value GO. Upper limiting value GO is, for example, 90% of the maximum allowable charging voltage CVL. In this way, damage as a result of an overcharge of battery cell 2 is reliably prevented.

A discharging of a battery cell 2 is omitted if its measured cell voltage UB at an operating point in time is less than a minimum allowable charging voltage DVL. A discharging of a battery cell 2 is omitted if its estimated cell voltage UB at an operating point in time is less than a lower limiting value GU. The lower limiting value GU is, for example, 110% of the minimum allowable charging voltage DVL. In this way, damage as a result of a deep discharge of battery cell 2 is reliably prevented.

Figure 3:
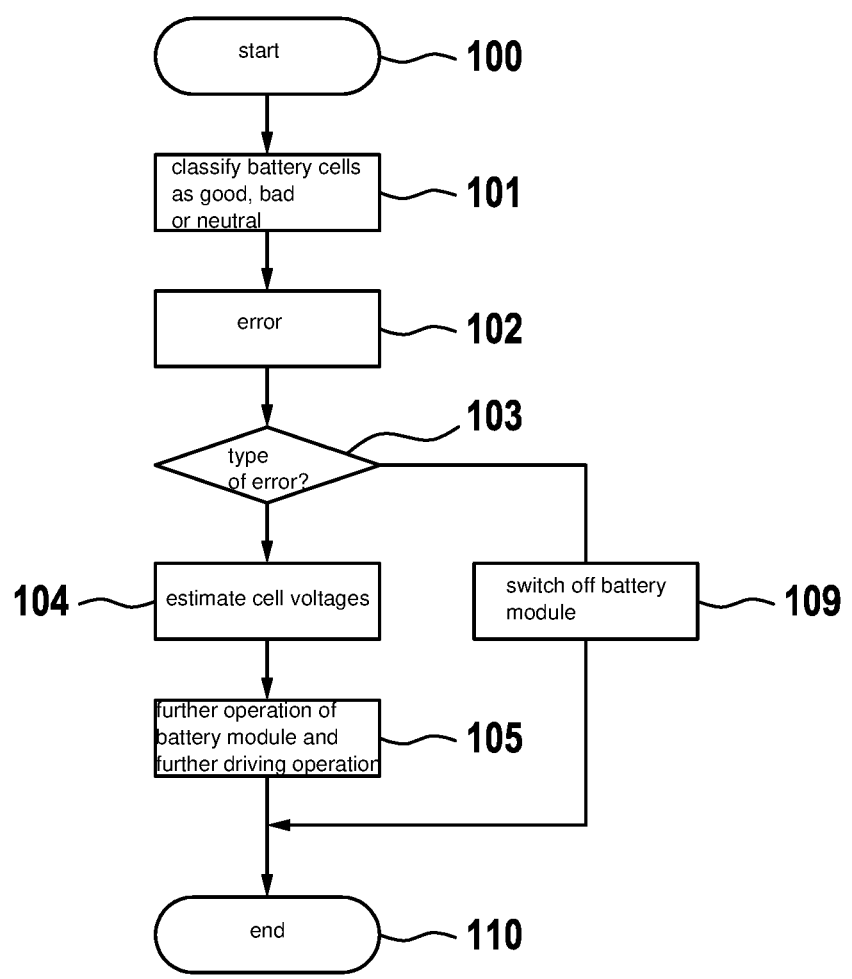
FIG. 3 schematically shows a representation of a method for operating a battery module, in accordance with an example embodiment of the present invention.

FIG. 3 schematically shows a representation of a method for operating a battery module 5, in accordance with an example embodiment of the present invention.

In a starting step 100, cell voltages US of battery cells 2 of battery module 5 are ascertained at a starting point in time. Average cell voltage MS at the starting point in time is ascertained from cell voltages US of battery cells 2 ascertained at the starting point in time. Similarly, upper threshold value SO is ascertained as the sum of average cell voltage MS at the starting point in time and tolerance value T. Lower threshold value SU is also ascertained as the difference of average cell voltage MS at the starting point in time and of tolerance value T.

In a following step 101, those battery cells 2, whose cell voltage US at the starting point in time is higher than upper threshold value SO, are classified as good battery cells 2. Those battery cells 2, whose cell voltage US at the starting point in time is less than lower threshold value SU, are also classified as bad battery cells 2. Similarly, those battery cells 2, whose cell voltage US at the starting point in time is less than upper threshold value SO or equal to upper threshold value SO and higher than lower threshold value SU or equal to lower threshold value SU, are classified as neutral battery cells 2.

In a next step 102, an error occurs at one operating point in time. For example, a measuring line of battery module 5 is interrupted. Because of this error, at least cell voltage UB of at least one battery cell 2 is no longer measurable at the operating point in time. In battery module 5 depicted in FIG. 1, an interruption of a measuring line may also cause cell voltages UB of two adjacent battery cells 2 to no longer be measurable at the operating point in time.

In a following step 103, the battery management system determines which type of error is present based on all available measuring values.

If, for example, a short-circuit is present in one of battery cells 2, then a short-circuit current flows in relevant battery cell 2, which causes a strong temperature increase of battery cell 2. The battery management system registers the temperature increase, deduces in step 103 a short-circuit in battery cell 2, and subsequently switches off battery module 5 in a step 109.

If, for example, a line interruption is present in battery module 5 between battery cells 2, then a total voltage UGes is no longer measurable, or the battery management system measures presumably a total voltage UGes of battery module 5 of approximately zero volts. The battery management system deduces in step 103 a line interruption in battery module 5 and subsequently switches off battery module 5 in a step 109.

After battery module 5 is switched off in step 109, the operation of battery module 5 and the driving operation of the vehicle then ends with a final step 110.

If no temperature increase indicating a short-circuit is measured, and if total voltage UGes of battery module 5 continues to be measurable and provides plausible measured values, then the battery management system deduces in step 103 an interruption of a measuring line between battery cells 2 and measuring circuit 50.

In this case, cell voltages UB of relevant battery cells 2, whose cell voltages UB are no longer measurable at the operating point in time due to the interruption of the measuring line, are estimated at the operating point in time in a subsequent step 104.

In a subsequent step 105, a further operation of battery module 5 takes place, as well as a further driving operation of the vehicle.

The operation of battery module 5 and the driving operation of the vehicle end at a later point in time with final step 110.

The present invention is not limited to the exemplary embodiments described herein and to the aspects highlighted therein. Instead, a multitude of modifications are possible within the scope of the present invention, which fall within the routine practice of those skilled in the art.

What is claimed is:

1. A method for operating a battery module for a vehicle, including multiple individual battery cells, the method comprising:
    a) ascertaining a cell voltage of each of the individual battery cells at a starting point in time;
    b) ascertaining an average cell voltage from the cell voltages ascertained at the starting point in time of the battery cells;
    c) estimating a cell voltage of at least one battery cell of the battery cells at an operating point in time when the cell voltage of the battery cell is no longer measurable at the operating point in time, wherein the cell voltage of the battery cell ascertained at the starting point in time, the average cell voltage ascertained at the starting point in time, and an average cell voltage ascertained at the operating point in time are taken into account when estimating the cell voltage of the battery cell at the operating point in time, and wherein the average cell voltage ascertained at the operating point in time is ascertained from the cell voltages of remaining ones of the battery cells measured at the operating point in time;
    determining when there is an error in the battery cells and/or the battery module at the operating point in time;
    determining a type of the error;
    depending on the type of the error, either operating the battery module and providing for driving operation of the vehicle, or switching off the battery module and ending the driving of the vehicle.

2. The method as recited in claim 1, wherein after step b), performing the following:
    ascertaining an upper threshold value as a sum of the average cell voltage ascertained at the starting point in time and a tolerance value;
    ascertaining a lower threshold value as a difference of the average cell voltage ascertained at the starting point in time and a tolerance value;

classifying ones of the battery cells whose cell voltage at the starting point in time is higher than the upper threshold value, as good battery cells;

classifying ones of the battery cells whose cell voltage at the starting point in time is less than the lower threshold value, as bad battery cells;

classifying ones of the battery cells whose cell voltage at the starting point in time is less than the upper threshold value and higher than the lower threshold value, as neutral battery cells.

3. The method as recited in claim 2, wherein the cell voltage of a good battery cell at the operating point in time is estimated as a sum of the average cell voltage ascertained at the operating point in time and a difference of the cell voltage of the good battery cell ascertained at the starting point in time and the average cell voltage ascertained at the starting point in time.

4. The method as recited in claim 3, wherein a charging of the good battery cell and/or of the battery module is omitted when the cell voltage of the good battery cell estimated at the operating point in time is greater than an upper threshold value.

5. The method as recited in claim 3, wherein the cell voltage of a bad battery cell at the operating point in time is estimated as a sum of the average cell voltage ascertained at the operating point in time and a difference of the cell voltage of the bad battery cell ascertained at the starting point in time and the average cell voltage ascertained at the starting point in time.

6. The method as recited in claim 5, wherein a discharging of the bad battery cell and/or of the battery module is omitted when the cell voltage of the bad battery cell estimated at the operating point in time is less than a lower limiting value.

7. The method as recited in claim 3, wherein the cell voltage of a neutral battery cell at the operating point in time is estimated as the average cell voltage ascertained at the operating point in time.

8. The method as recited in claim 7, wherein a charging of the neutral battery cell and/or of the battery module is omitted when the cell voltage of the neutral battery cell estimated at the operating point in time is greater than an upper limiting value and/or when the cell voltage of at least one good battery cell measured at the operating point in time is greater than the upper limiting value.

9. The method as recited in claim 7, wherein a discharging of the neutral battery cell and/or of the battery module is omitted, when the cell voltage of the neutral battery cell estimated at the operating point in time is less than a lower limiting value and/or when the cell voltage of at least one bad battery cell measured at the operating point in time is less than the lower limiting value.

10. The method as recited in claim 1, wherein the vehicle is one of a purely electric vehicle, a hybrid vehicle, a plug-in-hybrid vehicle, or an e-bike.

* * * * *